United States Patent [19]

Yoshida

[11] Patent Number: 5,371,352

[45] Date of Patent: Dec. 6, 1994

[54] PHOTODETECTOR COMPRISING A TEST ELEMENT GROUP OF PN JUNCTIONS AND INCLUDING A MASK HAVING AT LEAST ONE WINDOW SPACED APART FROM THE PN JUNCTIONS

[75] Inventor: Yasuaki Yoshida, Itami, Japan

[73] Assignee: Mitsubishi Denki Kabushiki Kaisha, Tokyo, Japan

[21] Appl. No.: 85,990

[22] Filed: Jul. 6, 1993

[30] Foreign Application Priority Data

Jan. 29, 1993 [JP] Japan .................... 5-013608

[51] Int. Cl.$^5$ ............... H01L 27/14; H01L 31/18
[52] U.S. Cl. ..................... 250/208.2; 324/767
[58] Field of Search ........... 250/208.1, 208.2, 214 R, 250/237 R; 324/158 D; 257/435

[56] References Cited

U.S. PATENT DOCUMENTS 5,174,858 12/1992 Yamamoto et al. ............... 156/643

FOREIGN PATENT DOCUMENTS 62-11393 1/1987 Japan .
2174161 7/1990 Japan .
2246662 2/1992 United Kingdom .

Primary Examiner—Edward P. Westin
Assistant Examiner—John R. Lee
Attorney, Agent, or Firm—Leydig, Voit & Mayer

[57] ABSTRACT

A photodetector includes a light responsive element including a semiconductor layer having a plurality of first spaced apart p-n junctions for generating electrical signals in response to incident light, a test element group (TEG) for testing an electrical characteristic of the first p-n junctions, the test element group including a plurality of second spaced apart p-n junctions in the semiconductor layer, and a light shielding mask covering the second spaced apart p-n junctions and preventing incident light from reaching the second spaced apart p-n junctions. The light shielding mask includes at least one window transmitting light, and the window is spaced from each of the second spaced apart p-n junctions. During testing of the electrical characteristics of the photodetector using the TEG, light is not incident directly on the second p-n junctions of the TEG but incident on the semiconductor layer through the window spaced from the second p-n junctions, and the maximum diffusion length of the minority charge carriers in the light responsive element is detected from the result of the test using the TEG. Therefore, the spatial resolution of the photodetector included in a wafer is monitored, and the photodetector is distinguished as defective and nondefective according to the monitored spatial resolution.

12 Claims, 7 Drawing Sheets

PHOTODETECTOR COMPRISING A TEST ELEMENT GROUP OF PN JUNCTIONS AND INCLUDING A MASK HAVING AT LEAST ONE WINDOW SPACED APART FROM THE PN JUNCTIONS

FIELD OF THE INVENTION

The present invention relates to a photodetector including a test element group (hereinafter referred to as TEG).

BACKGROUND OF THE INVENTION

FIG. 10 is a perspective view illustrating a conventional infrared imaging device. The infrared imaging device 90 includes a two-dimensional array of photodiodes 1, for example, 128×128 photodiodes, for generating electric signals in response to infrared light 4 incident on the respective photodiodes. The photodiode array is mounted on and electrically connected to a silicon substrate 2 containing signal processing circuitry. Each photodiode is in electrical communication with a respective signal processing circuit in the substrate 2 through a columnar body 3, such as a cylindrical volume of indium.

The general electrical arrangement of the imaging array 90 is schematically illustrated in FIG. 11 for a 3×3 array of photodiodes 1a to 1i. The signal processing circuitry in the substrate 2 includes a horizontal CCD 2b to which three vertical CCDs 2a are connected. An output circuit 5 is connected to the horizontal CCD 2b.

A description is given of the operation.

Incident infrared light 4 causes the photodiodes 1a to 1i to produce electrical charges that are conducted through the connectors 3 to the respective signal processing circuits in the substrate 2. The signal processing circuit stores the electrical charges and eventually transfers them in a timed sequence through the vertical CCDs 2a to the horizontal CCD 2b. The horizontal CCD 2b further transfers the stored electrical charges in a timed sequence through the output circuit 5 to the outside. In the detection of infrared light having wavelength of about 10 microns, the two-dimensional photodiode array 1 may employ $Cd_{0.2}Hg_{0.8}Te$.

FIG. 8 is a plan view illustrating a photodetector employing $Cd_{0.2}Hg_{0.8}Te$, and FIG. 9 is a sectional view taken along line IX—IX.

In these figures, a $Cd_{0.2}Hg_{0.8}Te$ layer 8 is disposed on a CdTe substrate 9. Reference numeral 11 designates a light responsive region. In the light responsive region 11, a two-dimensional array of p-n junctions 10 serving as pixels is disposed within the $Cd_{0.2}Hg_{0.8}Te$ layer 8, and n side electrode pads 13 are disposed on the respective p-n junctions 10. P side electrode pads 14 are disposed on a p side electrode metal 15. The p side electrode metal 15 is disposed on the $Cd_{0.2}Hg_{0.8}Te$ layer 8. A TEG 12 for monitoring the characteristics of the p-n junctions 10 in the light responsive region 11 is disposed on the same surface as the light responsive region 11 but outside the region 11. The TEG 12 consists of p-n junctions 10a disposed within the $Cd_{0.2}Hg_{0.8}Te$ layer 8, n side electrode pads 13a disposed on the respective p-n junctions 10a, and a p side electrode pad 14a disposed on the p side electrode metal 15. The p-n junctions 10 in the light responsive region 11 and the p-n junctions 10a in the TEG 12 are produced at the same time. An insulating film 16 that is transparent to infrared light, such as ZnS, is selectively disposed on the $Cd_{0.2}Hg_{0.8}Te$ layer 8 to separate the electrode pads 13, 13a, 14, and 14a from each other. Although the light responsive region 11 shown in FIG. 8 includes 3×3 pixels 10 for simplification, the light responsive region usually includes more pixels, for example, 128×128 pixels.

The TEG 12 is for monitoring characteristics of the p-n junctions 10 in the light responsive region 11. More specifically, probes of a probe card are applied to the p side electrode pad 14a and one of the n side electrode pads 13a to measure I-V characteristics of the p-n junction 10a opposite the n side electrode pad 13a, whereby characteristics of the p-n junctions 10 in the row corresponding to the probed p-n junction 10a are measured. This characteristic measurement using the TEG 12 is carried out after the wafer process, i.e., after fabricating a plurality of photodetectors on a wafer, and then the photodetectors on the wafer are sorted into defective photodetectors and non-defective photodetectors according to the results of the measurement. Thereafter, the indium connectors 3 are formed on the n side electrode pads 13 and the p side electrodes pads 14 of a non-defective photodetector, and the photodetector is flipped over and mounted upside down on the silicon CCD substrate 2, completing the infrared imaging device of FIG. 10.

However, from the measured I-V characteristics of the TEG 12, only the presence or absence of the p-n junction 10 in the light responsive region 11 is detected. Even if a photodetector has insufficient resolution caused by an excessive diffusion length of the minority charge carriers in the semiconductor layer 8 in which the p-n junctions 10 are formed, the insufficient resolution is not detected from the I-V characteristics of the TEG 12, and this photodetector is selected as non-defective. Therefore, even an infrared imaging device including a photodetector selected as a non-defective sometimes forms an indistinct image or, in the worst case, forms no image.

In order to solve the above-described problems, it is thought that the characteristic measurement of the photodetector should be carried out using a conventional resolution measuring apparatus.

FIG. 12 is a schematic diagram illustrating a resolution measuring apparatus. The resolution measuring apparatus 110 consists of a Dewar 54 for containing and cooling an imaging device 1a, an optical system 52 for collecting infrared light 4 from an infrared light source 51 and irradiating the imaging device 1a in the Dewar 54 with a spot of light, an amplifier 56 for detecting the light output from the imaging device 1a, and an oscilloscope 55 for displaying the light output on a screen. Reference numeral 53 designates a chopper for periodically interrupting the continuous infrared light 4. Reference numeral 54a designates a cooler for cooling the Dewar 54, which is filled with liquid nitrogen.

In operation, the light produced by the infrared light source 51 and the optical system 52 is applied to the light responsive region of the infrared device, and the light output from the infrared device is measured by the oscilloscope 55. The spatial resolution of the light responsive region is evaluated by the position of the light and the output voltage from the p-n junction in the light responsive region. However, it is impossible for the Dewar 54 to contain a large-sized wafer including a plurality of photodetectors 1. In addition, the space between the optical system 52 and the Dewar 54 is not variable. Therefore, it is impossible to evaluate the resolution of the photodetector on the wafer by irradiating the photodetector with the light using the apparatus of FIG. 12.

SUMMARY OF THE INVENTION

It is an object of the present invention to provide a photodetector including a TEG that detects the spatial resolution of the light responsive region.

Other objects and advantages of the present invention will become apparent from the detailed description give hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a photodetector includes a light responsive element including a semiconductor layer having a plurality of first spaced apart p-n junctions for generating electrical signals in response to incident light, a test element group for testing an electrical characteristic of the first p-n junctions, the test element group including a plurality of second spaced apart p-n junctions in the semiconductor layer, and a light shielding mask covering the second spaced apart p-n junctions and preventing incident light from reaching the second spaced apart p-n junctions. The light shielding mask includes at least one window transmitting light, and the window is spaced from each of the second spaced apart p-n junctions. When measuring the electrical characteristics of the photodetector using the test element group, light is not incident directly on the second p-n junctions of the test element group but incident on the semiconductor layer through the window spaced from the second p-n junctions. A second p-n junction that is spaced from the light incident region of the semiconductor layer by a distance shorter than the maximum diffusion length of the minority charge carriers, senses the light, and a second p-n junction that is spaced from the light incident region by a distance longer than the maximum diffusion length of the minority charge carriers, does not sense the light. Therefore, by measuring signals from the respective second p-n junctions, the spatial resolution of the first p-n junctions of the light responsive element are monitored.

DETAILED DESCRIPTION OF THE PREFERRED EMBODIMENTS

Figure 1:
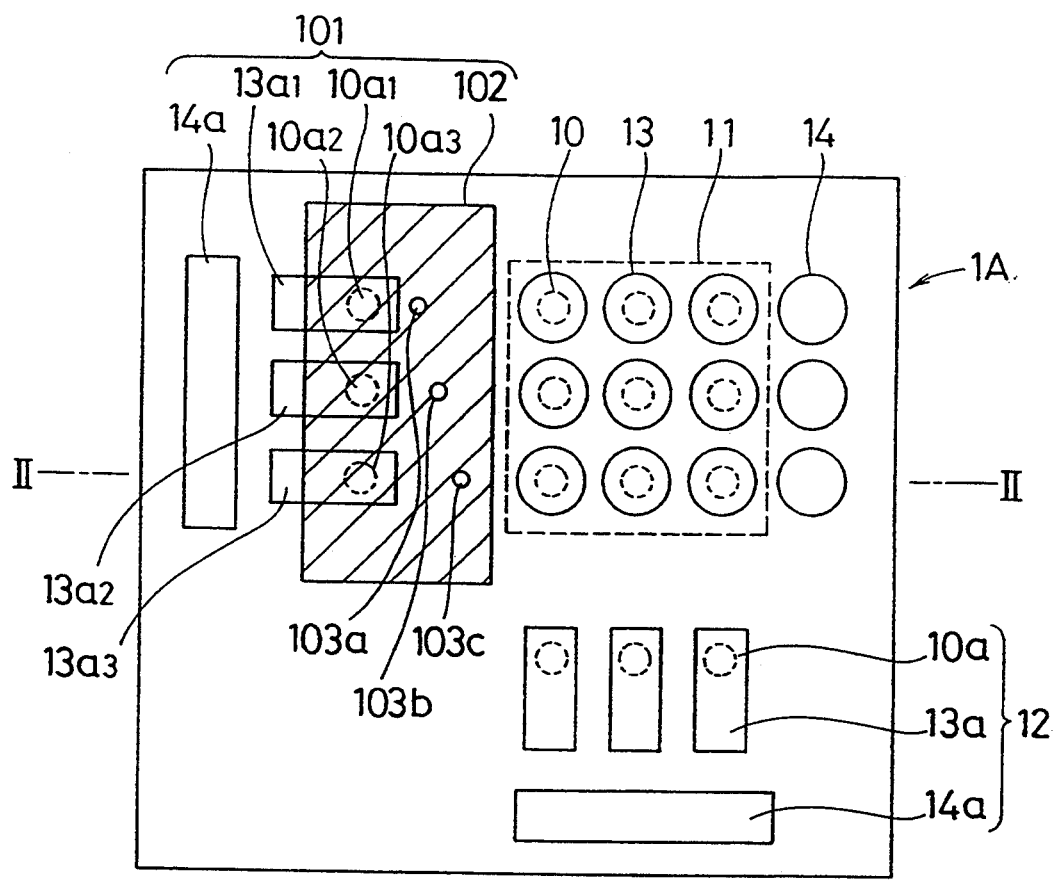
FIG. 1 is a plan view illustrating a photodetector in accordance with a first embodiment of the present invention.
Figure 2:
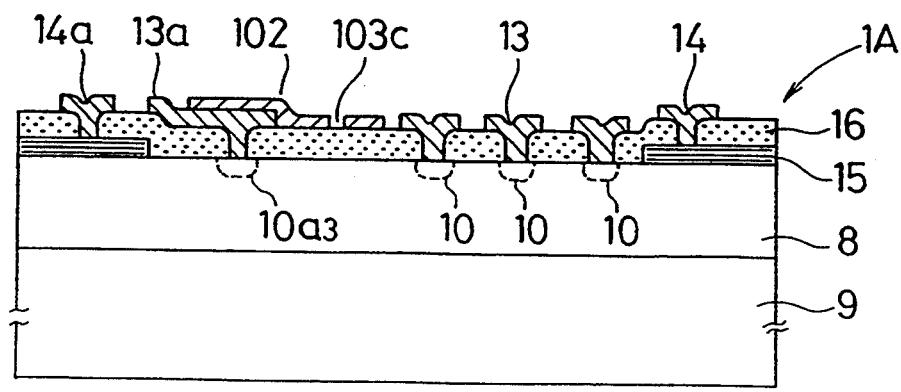
FIG. 2 is a cross-sectional view taken along line II—II of FIG. 1.

FIG. 1 is a plan view illustrating a photodetector in accordance with a first embodiment of the present invention, and FIG. 2 is a sectional view taken along line II—II of FIG. 1. In these figures, the same reference numerals as those in FIGS. 7 and 8 designate the same or corresponding parts. The photodetector 1A of this embodiment includes a TEG 101, a part of which is covered with a mask 102 for shielding the p-n junctions 10a1 to 10a3 from the infrared light. Infrared light transmitting windows 103a to 103c penetrate through prescribed portions of the mask 102. The windows 103a to 103c correspond to the p-n junctions 10a1 to 10a3, respectively. The respective spacings between the p-n junction 10a1 and the window 103a, between the p-n junction 10a2 and the window 103b, and between the p-n junction 10a3 and the window 103b increase in this order. The light shielding mask 102 comprises a material that is not transparent to infrared light, such as $SiO_2$, and covers portions of the n side electrode pads 13a1 to 13a3 and a portion of the insulating film 16 in the vicinity of the n side electrode pads. The diameter of each infrared light transmitting window is about 20 microns.

A description is given of a method for measuring the spatial resolution of the light responsive region 11 of the photodetector 1A using the TEG 101.

Figure 7:
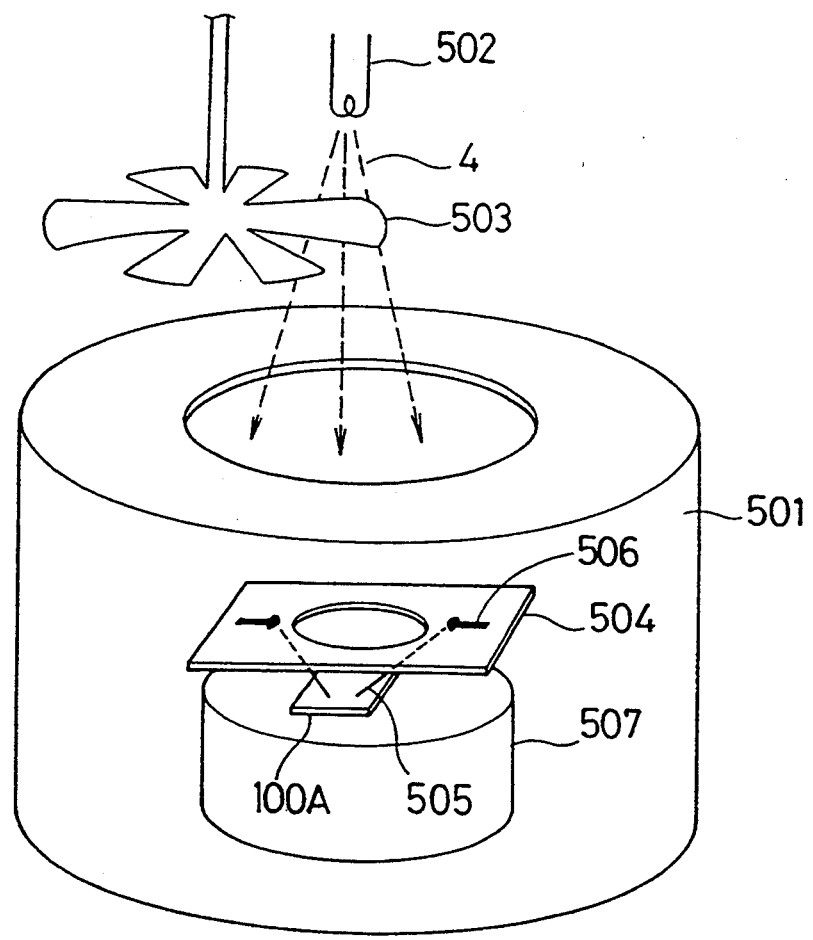
FIG. 7 is a perspective view illustrating an apparatus for measuring spatial resolution in light responsive regions of photodetectors on a wafer.
Figure 8:
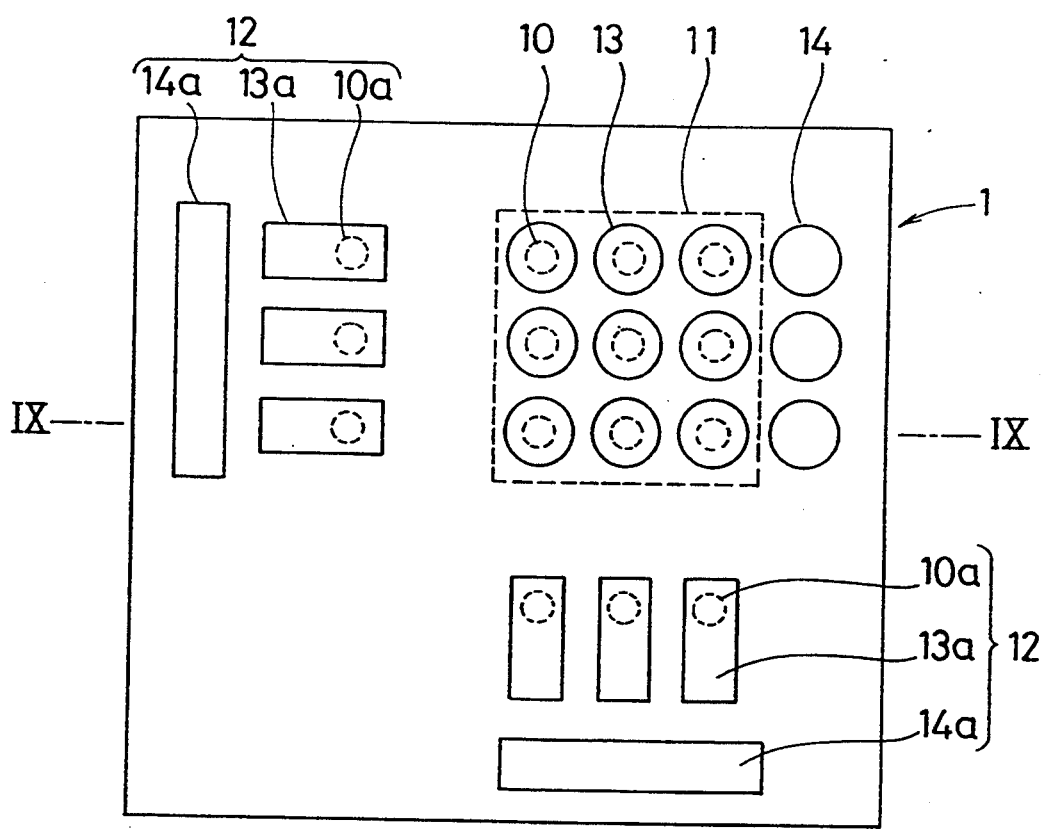
FIG. 8 is a plan view illustrating a photodetector in accordance with the prior art.
Figure 9:
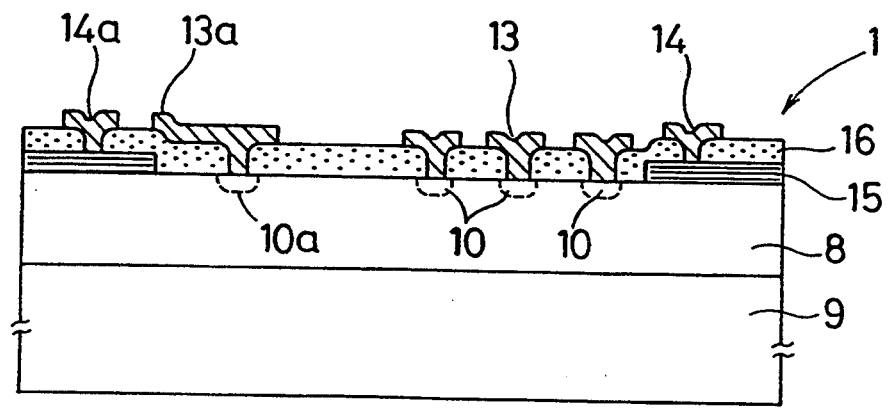
FIG. 9 is a cross-sectional view taken along line IX—IX of FIG. 8.
Figure 10:
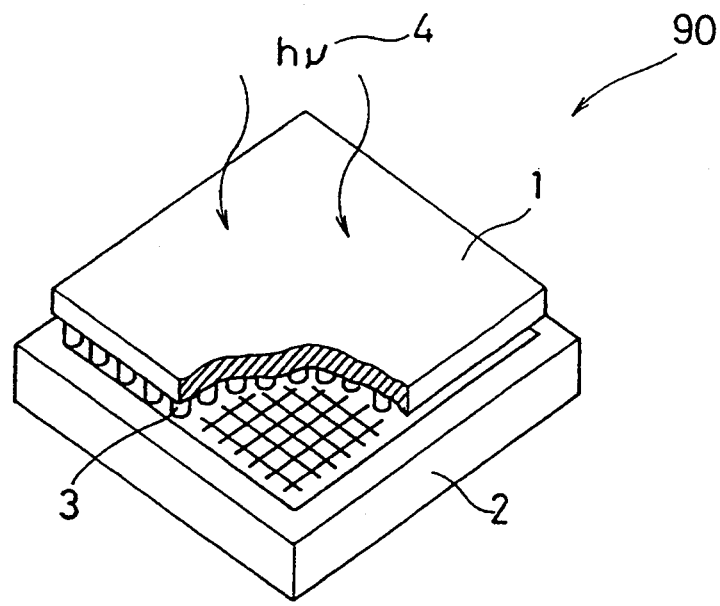
FIG. 10 is a perspective view illustrating an infrared imaging device.
Figure 11:
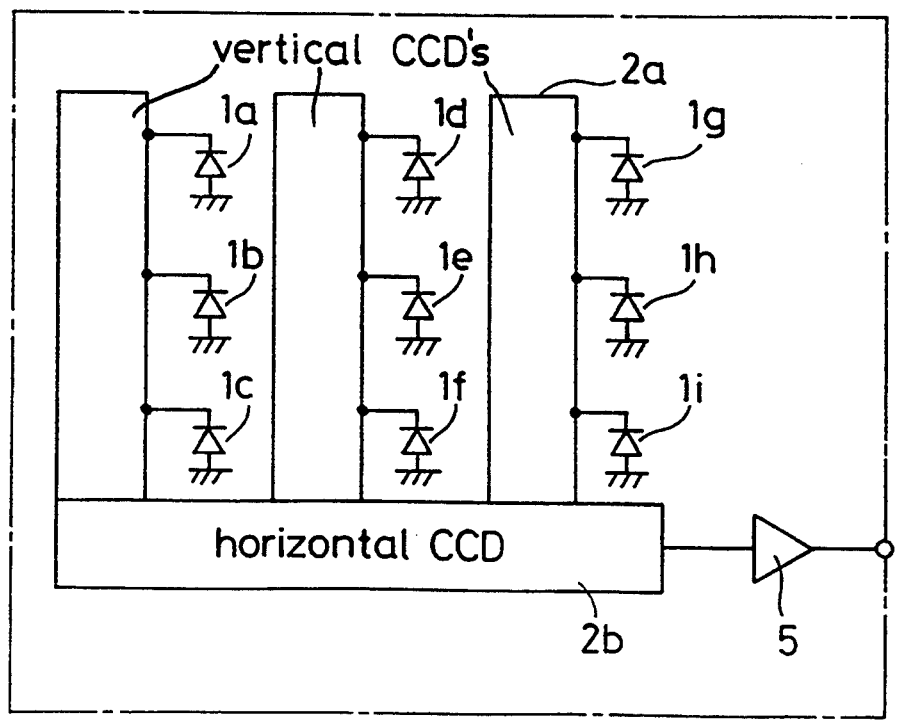
FIG. 11 is a circuit diagram illustrating an example of the infrared imaging device of FIG. 10.
Figure 12:
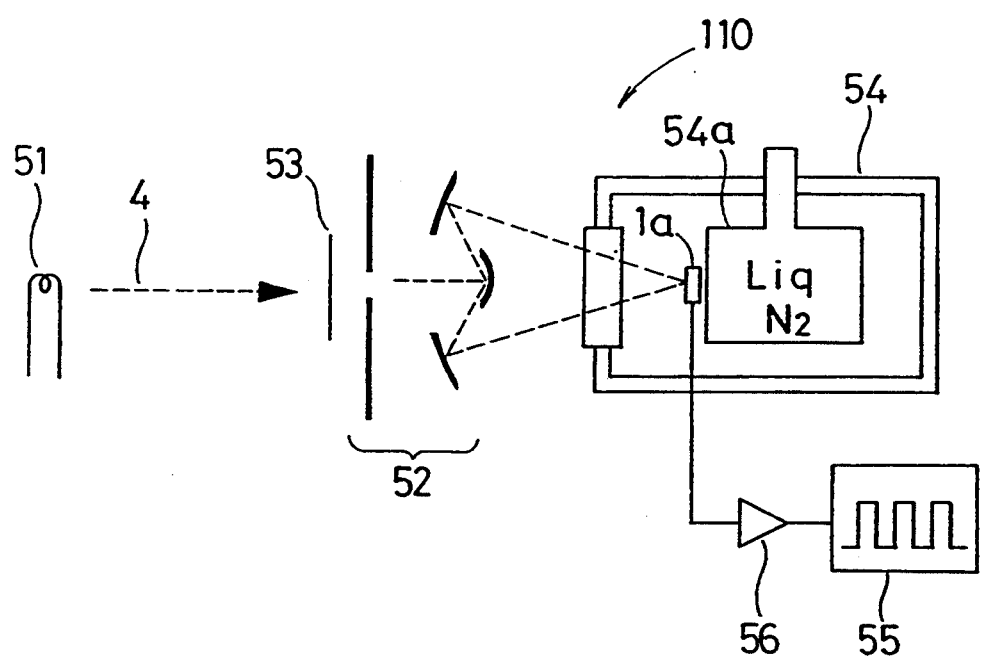
FIG. 12 is a schematic diagram illustrating an apparatus for measuring a spatial resolution of an infrared imaging device in accordance with the prior art.

FIG. 7 is a perspective view schematically illustrating a spatial resolution measuring apparatus according to the first embodiment of the present invention. In the figure, reference numeral 100A designates a wafer including a plurality of photodetectors 1A of FIG. 1. The spatial resolution measuring apparatus includes an infrared light source 502, a container 501 in which a pedestal 507 including a cooling mechanism is disposed, a chopper 503 for periodically interrupting the continuous infrared light 4 incident on the wafer 100A, and a probe card 504 for detecting signals from the TEG 101 of the photodetector 1A included in the wafer 100A. Reference numerals 505 and 506 designate probes and signal lines of the probe card 504.

Initially, the wafer 100A is put on the pedestal 507, and the probes 505 of the probe card 504 are applied to the p side electrode pad 14a and one of the n side electrode pads 13a1 to 13a3 of the TEG 101 while the signal lines 506 are connected to an amplifier (not shown) and a synchroscope (not shown). In this state, the infrared light 4 from the light source 502 is applied to the entire surface of the wafer 100A while periodically interrupting the infrared light 4 by the chopper 503. Since the p-n junctions 10a1 to 10a3 of the TEG 101 are covered with the light shielding mask 102, only minority charge carriers, which are produced in response to the light incident on the semiconductor layer 8 through the light transmitting windows 103a to 103c, reach the p-n junctions 10a1 to 10a3. Therefore, if signals are detected from the p-n junctions 10a1 and 10a2 when the probe is applied to the corresponding n side electrode pads 13a1 and 13a2 but no signal is detected from the p-n junction 10a3 when the probe is applied to the corresponding n side electrode pad 13a3, it is supposed that the maximum diffusion length of the minority charge carrier is less than the interval between the p-n junction 10a3 and the infrared light transmitting window 103c.

The spatial resolution of the light responsive region 11 is monitored by measuring signals from the electrode pads 13a to 13c corresponding to the p-n junctions 10a1 to 10a3, respectively. In this way, the spatial resolutions of the photodetectors included in the wafer are monitored and defective photodetectors are separated from the non-defective photodetectors according to their spatial resolutions.

While in the above-described first embodiment the light responsive region 11 includes 3×3 pixels for simplification, the region 11 usually includes about 128×128 pixels and, therefore, the TEG 101 usually includes more p-n junctions, n side electrode pads, and infrared light transmitting windows than shown in FIGS. 1 and 2 in accordance with the number of the pixels.

Figure 3:
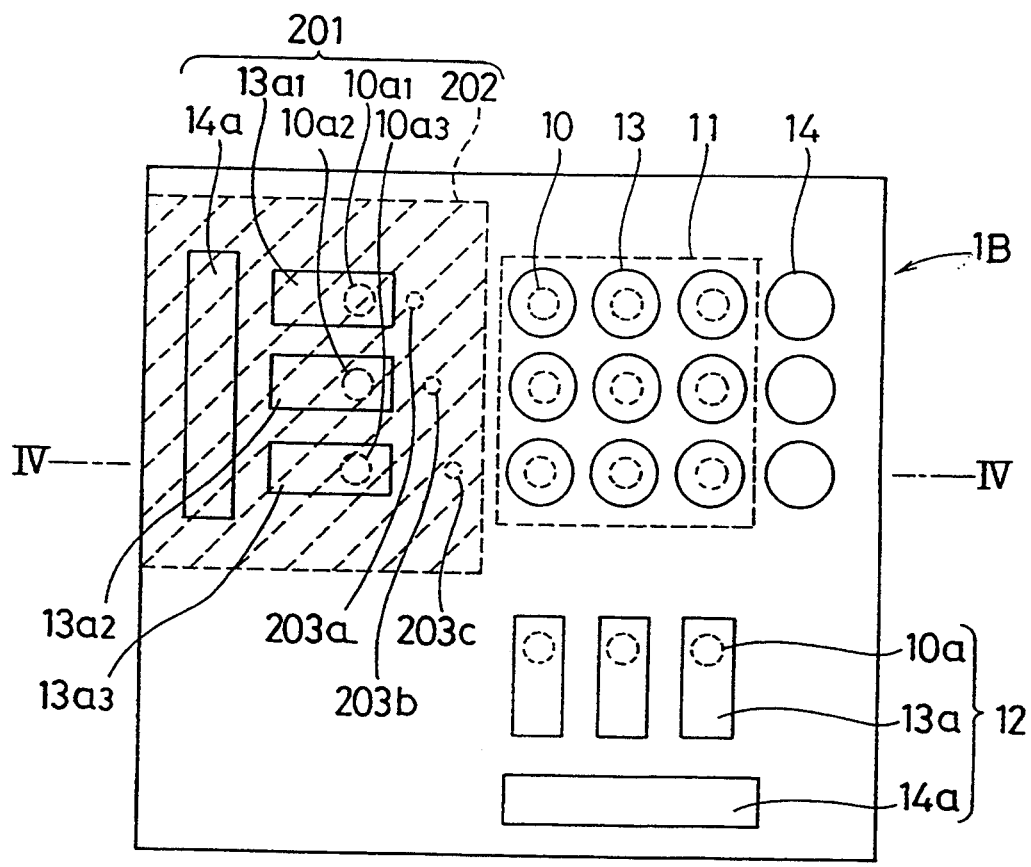
FIG. 3 is a plan view illustrating a photodetector in accordance with a second embodiment of the present invention.
Figure 4:
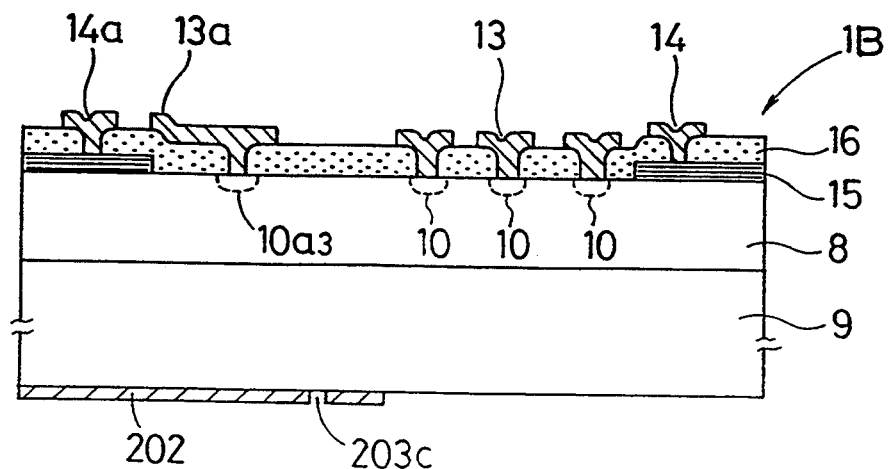
FIG. 4 is a cross-sectional view taken along line IV—IV of FIG. 3.

FIG. 3 is a plan view illustrating a photodetector in accordance with a second embodiment of the present invention, and FIG. 4 is a cross-sectional view taken along line IV—IV of FIG. 3. In these figures, the same reference numerals as in FIGS. 1 and 2 designate the same or corresponding parts. In this second embodiment, the photodetector 1B includes a TEG 201 having a light shielding mask 202 disposed on the rear surface of the substrate 9. The light shielding mask 202 protects the p-n junctions 10a1 to 10a3 and a region in the vicinity of the p-n junctions from infrared light incident on the rear surface of the substrate 9. The light shielding mask 202 has three infrared light transmitting windows 203a to 203b corresponding to the p-n junctions 10a1 to 10a3 on the opposite surface, respectively. The respective spacings between the p-n junction 10a1 and the window 203a, between the p-n junction 10a2 and the window 203b, and between the p-n junction 10a3 and the window 203c increase in this order. The light shielding mask 202 comprises a material that does not transmit infrared light, such as $SiO_2$, and the diameter of each window is about 20 microns.

A description is given of the method for measuring the spatial resolution of the light responsive region 11 of the photodetector 1B using the TEG 201.

The probes 505 of the probe card 504 are applied to the p side electrode pad 14a and one of the n side electrode pads 13a1 to 13a3 of the TEG 201 while irradiating the rear surface of the substrate 9 with infrared light, and signals from the TEG 201 are detected, whereby the spatial resolution of the light responsive region 11 of the photodetector 1B is monitored. In this way, the spatial resolutions of the photodetectors included in the wafer are monitored and defective photodetectors are separated from non-defective photodetectors according to their spatial resolutions.

Figure 5:
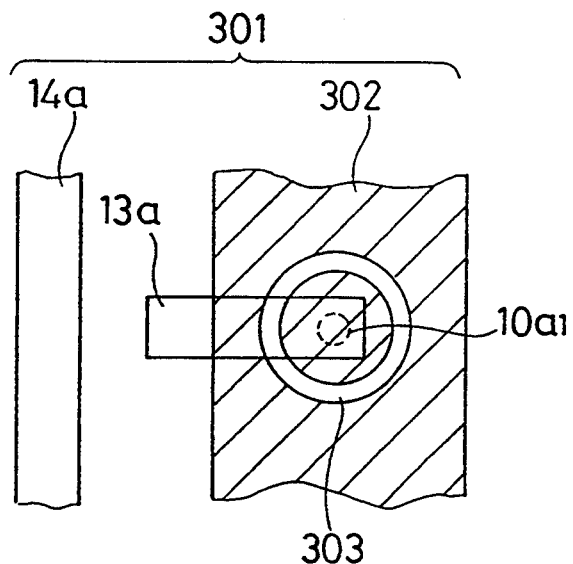
FIG. 5 is a plan view illustrating a TEG included in a photodetector in accordance with a third embodiment of the present invention.

FIG. 5 is an enlarged view of a part of a TEG included in a photodetector according to a third embodiment of the present invention. In the figure, the same reference numerals as in FIGS. 1 and 2 designate the same or corresponding parts.

In this third embodiment, an infrared light transmitting window 303 penetrating through the light shielding mask 302 is annular with the opposite p-n junction (in FIG. 5, p-n junction 10a1) as the center. A plurality of annular windows are formed in the mask 302 at positions opposite the respective p-n junctions although they are not shown in FIG. 5. In this structure, the quantity of infrared light incident on the TEG 301 while monitoring the spatial resolution of the light responsive region is increased compared with the photodetectors according to the first and second embodiments, which facilitates signal measurement and improves monitoring precision.

Figure 6:
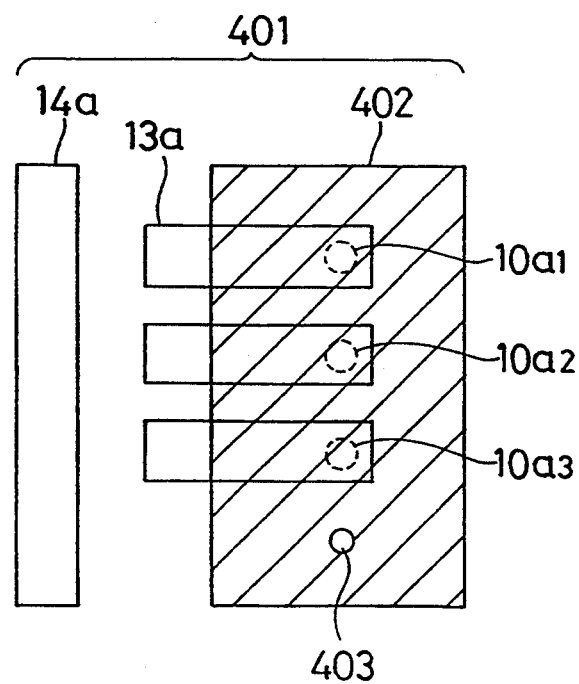
FIG. 6 is a plan view illustrating a TEG included in a photodetector in accordance with a fourth embodiment of the present invention.

FIG. 6 is an enlarged view of a TEG included in a photodetector in accordance with a fourth embodiment of the present invention. In FIG. 6, the same reference numerals as in FIGS. 1 and 2 designate the same or corresponding parts.

In this fourth embodiment, only one infrared light transmitting window 403 penetrates through the light shielding mask 402 which covers the p-n junctions 10a1 to 10a3 and a region in the vicinity of the p-n junctions. In this structure, the infrared light transmitting window 403 is common to the p-n junctions 10a1 to 10a3, and it is positioned nearest to the p-n junction 10a3 and farthest from the p-n junction 10a1. Since the light shielding mask 402 has only one window 403, the size of the shielding mask is reduced, resulting in a small-sized photodetector.

While in the above-described third and fourth embodiments the light shielding mask is disposed on the surface of the semiconductor layer 8, the mask may be disposed on the rear surface of the substrate if the infrared light is incident on the rear surface.

What is claimed is:

1. A photodetector comprising:
   a light responsive element including a semiconductor material having a plurality of first spaced apart p-n junctions for generating electrical signals in response to incident light;
   a test element group for testing an electrical characteristic of said first p-n junctions, the test element group including a plurality of second spaced apart p-n junctions in the semiconductor material; and
   a light shielding mask covering the second spaced apart p-n junctions and preventing incident light from reaching the second spaced apart p-n junctions, the light shielding mask including at least one window transmitting light, the window being spaced from each of the second spaced apart p-n junctions.

2. The photodetector of claim 1 wherein the at least one window is spaced by a different distance from each of the second spaced apart p-n junctions.

3. The photodetector of claim 1 including a plurality of windows in the light shielding mask, each window corresponding to one of the second spaced apart p-n junctions.

4. The photodetector of claim 3 wherein each window is spaced from the corresponding second p-n junction by a respective distance and each of the respective distances is different.

5. The photodetector of claim 1 wherein the semiconductor material comprises a semiconductor substrate and a semiconductor layer disposed on the semiconductor substrate, the substrate having opposed front and rear surfaces.

6. The photodetector of claim 5 wherein the light shielding mask is disposed on the rear surface of the semiconductor substrate.

7. The photodetector of claim 5 wherein the light shielding mask is disposed on the semiconductor layer.

8. The photodetector of claim 7 wherein an insulating film is interposed between and is in contact with the semiconductor layer and the light shielding mask.

9. The photodetector of claim 1 wherein the window is annular and one of the second spaced apart p-n junctions is disposed within the annular window.

10. The photodetector of claim 1 wherein the semiconductor substrate comprises CdTe and the semiconductor layer comprises $Cd_{0.2}Hg_{0.8}Te$.

11. The photodetector of claim 1 wherein the light shielding mask is an $SiO_2$ film.

12. The photodetector of claim 1 wherein the first and second spaced apart p-n junctions are formed simultaneously during manufacturing of the photodetector.

* * * * *